(12) United States Patent
Gershon et al.

(10) Patent No.: US 10,446,704 B2
(45) Date of Patent: Oct. 15, 2019

(54) FORMATION OF OHMIC BACK CONTACT FOR AG$_2$ZNSN(S,SE)$_4$ PHOTOVOLTAIC DEVICES

(71) Applicant: International Business Machines Corporation, Armonk, NY (US)

(72) Inventors: Talia S. Gershon, White Plains, NY (US); Oki Gunawan, Westwood, NJ (US); Richard A. Haight, Mahopac, NY (US); Ravin Mankad, Yonkers, NY (US)

(73) Assignee: International Business Machines Corporation, Armonk, NY (US)

( * ) Notice: Subject to any disclaimer, the term of this patent is extended or adjusted under 35 U.S.C. 154(b) by 347 days.

(21) Appl. No.: 14/984,512

(22) Filed: Dec. 30, 2015

(65) Prior Publication Data

US 2017/0194518 A1    Jul. 6, 2017

(51) Int. Cl.
*H01L 31/032* (2006.01)
*H01L 31/072* (2012.01)
*H01L 31/0224* (2006.01)

(52) U.S. Cl.
CPC .. *H01L 31/0326* (2013.01); *H01L 31/022425* (2013.01); *H01L 31/072* (2013.01); *Y02E 10/50* (2013.01)

(58) Field of Classification Search
None
See application file for complete search history.

(56) References Cited

U.S. PATENT DOCUMENTS

| | | | | |
|---|---|---|---|---|
| 4,379,943 A | * | 4/1983 | Yang | H01L 31/075 136/249 |
| 8,642,884 B2 | | 2/2014 | Mitzi et al. | |
| 9,608,141 B1 | * | 3/2017 | Gershon | H01L 31/022483 |

(Continued)

OTHER PUBLICATIONS

F. Liu et al., "Enhancing the Cu2ZnSnS4 solar cell efficiency by back contact modification: Inserting a thin TiB2 intermediate layer at Cu2ZnSnS4/Mo interface," Applied Physics Letters, vol. 104, No. 5, Feb. 2014, 051105, 5 pages.

(Continued)

*Primary Examiner* — Shannon M Gardner
(74) *Attorney, Agent, or Firm* — Vazken Alexanian; Michael J. Chang, LLC

(57) ABSTRACT

Techniques for forming an ohmic back contact for Ag$_2$ZnSn(S,Se)$_4$ photovoltaic devices. In one aspect, a method for forming a photovoltaic device includes the steps of: depositing a refractory electrode material onto a substrate; depositing a contact material onto the refractory electrode material, wherein the contact material includes a transition metal oxide; forming an absorber layer on the contact material, wherein the absorber layer includes Ag, Zn, Sn, and at least one of S and Se; annealing the absorber layer; forming a buffer layer on the absorber layer; and forming a top electrode on the buffer layer. The refractory electrode material may be Mo, W, Pt, Ti, TiN, FTO, and combinations thereof. The transition metal oxide may be TiO$_2$, ZnO, SnO, ZnSnO, Ga$_2$O$_3$, and combinations thereof. A photovoltaic device is also provided.

15 Claims, 4 Drawing Sheets

(56) References Cited

U.S. PATENT DOCUMENTS

| | | | |
|---|---|---|---|
| 2005/0284518 A1* | 12/2005 | Yamada | H01L 31/022425 |
| | | | 136/262 |
| 2010/0116331 A1 | 5/2010 | Kobayashi et al. | |
| 2011/0011460 A1* | 1/2011 | Munteanu | C23C 14/0057 |
| | | | 136/264 |
| 2011/0094557 A1* | 4/2011 | Mitzi | H01L 21/0237 |
| | | | 136/244 |
| 2012/0100663 A1 | 4/2012 | Bojarczuk et al. | |
| 2012/0132281 A1* | 5/2012 | Yang | H01L 31/0322 |
| | | | 136/260 |
| 2013/0056054 A1 | 3/2013 | Liang | |
| 2013/0081688 A1 | 4/2013 | Liang et al. | |
| 2014/0030843 A1 | 1/2014 | Ahmed et al. | |
| 2015/0136216 A1 | 5/2015 | Kurihara | |
| 2016/0087118 A1* | 3/2016 | Shibasaki | H01L 31/0749 |
| | | | 136/256 |

OTHER PUBLICATIONS

W. Li et al., "Inhibiting MoS2 formation by introducing a ZnO intermediate layer for Cu2ZnSnS4 solar cells," Materials Letters, vol. 130, May 2014, pp. 87-90.

H. Cui et al., "Boosting Cu2ZnSnS4 solar cells efficiency by a thin Ag intermediate layer between absorber and back contact," Applied Physics Letters, vol. 104, No. 4, Jan. 2014, 041115, 4 pages.

L.-Y. Yeh et al., "Preparation of the Ag—Zn—Sn—S quaternary photoelectrodes using chemical bath deposition for photoelectrochemical applications," Thin Solid Films, vol. 558, Feb. 2014, pp. 289-293.

\* cited by examiner

FORMATION OF OHMIC BACK CONTACT FOR AG$_2$ZNSN(S,SE)$_4$ PHOTOVOLTAIC DEVICES

STATEMENT OF GOVERNMENT RIGHTS

This invention was made with Government support under Contract number DE-EE0006334 awarded by The Department of Energy. The Government has certain rights in this invention.

FIELD OF THE INVENTION

The present invention relates to Ag$_2$ZnSn(S,Se)$_4$ photovoltaic devices, and more particularly, to techniques for forming an Ohmic back contact for Ag$_2$ZnSn(S,Se)$_4$ photovoltaic devices.

BACKGROUND OF THE INVENTION

Ag$_2$ZnSn(S,Se)$_4$ (AZTSSe) is an attractive photovoltaic absorber material. It is based on Cu$_2$ZnSn(S,Se)$_4$ (CZTSSe), but Ag is substituted for Cu to suppress bulk defects. See, for example, U.S. patent application Ser. No. 14/936,131 by Gershon et al., entitled "Photovoltaic Device Based on Ag$_2$ZnSn(S,Se)$_4$ Absorber," (hereinafter "U.S. patent application Ser. No. 14/936,131").

AZTSSe is intrinsically n-type, therefore other aspects of the device must be re-optimized. For instance, molybdenum (Mo) is typically used as the back contact material for CZTSSe photovoltaic devices. However, Mo is non-Ohmic to AZTSSe. Therefore, an Ohmic back contact is needed for the formation of AZTSSe thin film photovoltaic devices.

Further, a low-work function material is needed for making Ohmic contact to AZTSSe. This is due to well-understood physical principles involving Fermi level equilibration between the metallic contact and a semiconductor; to first order, low-work function materials tend to make Ohmic contact to n-type semiconductors whereas high work function materials tend to make Ohmic contact to p-type semiconductors. However, most low-work function metals are highly reactive with sulfur and selenium. For example, an aluminum back contact cannot be used because the annealing step may result in the complete consumption of the aluminum metal or else the formation of an unwanted aluminum selenide interlayer. Therefore, a stable low-work function contact material for AZTSSe thin film photovoltaic devices is needed.

SUMMARY OF THE INVENTION

The present invention provides techniques for forming an Ohmic back contact for Ag$_2$ZnSn(S,Se)$_4$ photovoltaic devices. In one aspect of the invention, a method for forming a photovoltaic device is provided. The method includes the steps of: depositing a refractory electrode material onto a substrate; depositing a contact material onto the refractory electrode material, wherein the contact material includes a transition metal oxide; forming an absorber layer on the contact material, wherein the absorber layer includes silver (Ag), zinc (Zn), tin (Sn), and at least one of sulfur (S) and selenium (Se); annealing the absorber layer; forming a buffer layer on the absorber layer, and forming a top electrode on the buffer layer. The refractory electrode material may be molybdenum (Mo), tungsten (W), platinum (Pt), titanium (Ti), titanium nitride (TiN), fluorinated tin oxide (FTO), and combinations thereof. The transition metal oxide may be titanium oxide (TiO$_2$), zinc oxide (ZnO), tin oxide (SnO), zinc tin oxide (ZnSnO), gallium oxide (Ga$_2$O$_3$), and combinations thereof.

In another aspect of the invention, a photovoltaic device is provided. The photovoltaic device includes: a substrate; a refractory electrode material on the substrate; a contact material on the refractory electrode material, wherein the contact material includes a transition metal oxide; an absorber layer on the contact material, wherein the absorber layer includes Ag, Zn, Sn, and at least one of S and Se; a buffer layer on the absorber layer; and a top electrode on the buffer layer. The photovoltaic device may also include: metal contacts on the top electrode.

A more complete understanding of the present invention, as well as further features and advantages of the present invention, will be obtained by reference to the following detailed description and drawings.

DETAILED DESCRIPTION OF PREFERRED EMBODIMENTS

As highlighted above, the bulk defects often encountered with CZTSSe-based absorber materials can be eliminated if one swaps out either Cu or Zn for a different 1+ or 2+ valence cation (respectively). The term "CZTSSe," as used herein, refers to a kesterite material containing copper (Cu), zinc (Zn), tin (Sn), and at least one of sulfur (S) and selenium (Se). When silver (Ag) is substituted for Cu, a Ag$_2$ZnSn(S, Se)$_4$ material is formed (abbreviated as AZTSSe). See U.S.

patent application Ser. No. 14/936,131, the contents of which are incorporated by reference as if fully set forth herein. Thus, the term "AZTSSe," as used herein, refers to a kesterite material containing Ag, Zn, Sn, and at least one of S and Se.

As also highlighted above, the implementation of AZTSSe materials presents some notable challenges. For instance, molybdenum (Mo), which is typically used as the back contact material for CZTSSe photovoltaic devices, is unfortunately non-Ohmic to AZTSSe due to the formation of an interfacial $MoSe_2$ layer (high-work function) which takes place during the annealing step. Advantageously, provided herein are techniques for forming Ohmic back contacts for AZTSSe photovoltaic devices.

As will be described in detail below, the present techniques involve inserting a stable, low-work function transition metal oxide contact material in between the Mo and the AZTSSe absorber. We will refer to "low-work function" materials as those with a work function below about 4.5 electronvolts (eV) and "high-work function" materials as those with a work function above about 4.5 eV. By way of example only, suitable low-work function transition metal oxide contact materials include, but are not limited to, titanium oxide ($TiO_2$), zinc oxide (ZnO), tin oxide (SnO), zinc tin oxide (ZnSnO), and/or gallium oxide ($Ga_2O_3$). With regard to stability, even if the transition metal oxide contact material chosen (e.g., $TiO_2$) reacts with S, Se to form $Ti(O,S(e))_2$, the work function of the oxyselenide remains low and therefore the contact to AZTSe is still Ohmic. The present photovoltaic devices will generally be formed as a stack containing the following materials: Mo/low-work function transition metal oxide contact material/AZTSSe absorber/buffer material/high-work function (front) contact or p-type heterojunction partner.

Figure 1A:
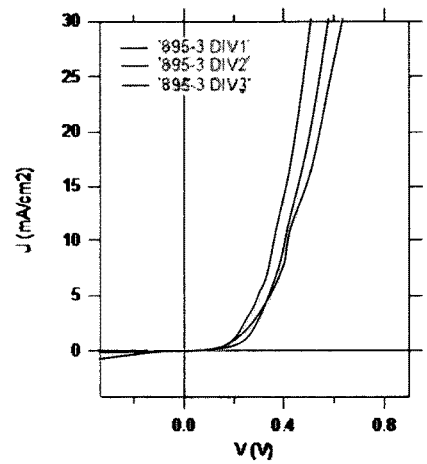
FIG. 1A is a J-V curve for a photovoltaic device with a low-work function transition metal oxide (TiO$_2$) between the Mo back contact and the AZTSSe absorber according to an embodiment of the present invention.
Figure 1B:
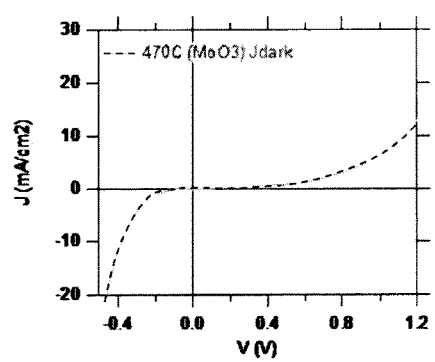
FIG. 1B is a J-V curve for a photovoltaic device without a low-work function transition metal oxide between the Mo back contact and the AZTSSe absorber.

It is hypothesized that Mo is non-Ohmic to AZTSSe due in part to the formation of a high-work function $Mo(S,Se)_2$ layer between the Mo and the AZTSSe. For instance, annealing a device stack containing Mo/AZTSSe/$MoO_3$/ITO forms a "double-diode" indicative of the presence of a reverse-junction (likely the formation of $MoSe_2$ between Mo and AZTSe. However, with the addition of $TiO_2$ between the AZTSSe and Mo (e.g., Mo/$TiO_2$/AZTSSe/$MoO_3$/ITO), the double diode feature is not observed. This indicates that the $TiO_2$ makes Ohmic contact to AZTSSe, whereas Mo (with $Mo(S,Se)_2$) does not. Compare, for example, J-V curves for sample with $TiO_2$ (FIG. 1A) and without $TiO_2$ (FIG. 1B) between the Mo and AZTSSe absorber.

Figure 2:
FIG. 2 is a cross-sectional diagram illustrating a refractory electrode material (e.g., Mo) having been deposited onto a substrate according to an embodiment of the present invention.

A detailed description of the present techniques is now provided by way of reference to FIGS. 2-7 which provide an exemplary methodology for forming an AZTSSe-based photovoltaic device. As shown in FIG. 2, the process begins with a substrate 202. For photovoltaic device applications, suitable substrates include, but are not limited to glass, ceramic, metal foil, or plastic substrates.

A refractory electrode material 204 is next deposited onto the substrate 202. Suitable refractory electrode materials include, but are not limited to, Mo, tungsten (W), platinum (Pt), titanium (Ti), titanium Nitride (TiN), and/or fluorinated tin oxide (FTO). The refractory electrode material 204 can be deposited onto the substrate 202 using, e.g., electron-beam (e-beam) evaporation, thermal evaporation, sputtering, etc. According to an exemplary embodiment, the refractory electrode material 204 is deposited on the substrate 202 to a thickness of from about 0.5 micrometer (μm) to about 2 μm, and ranges therebetween.

Figure 3:
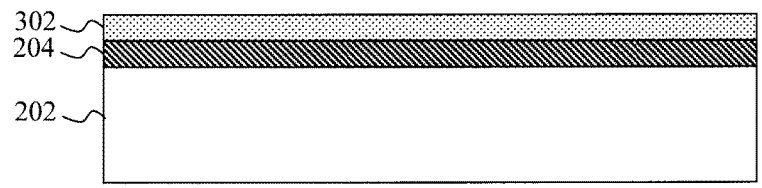
FIG. 3 is a cross-sectional diagram illustrating a contact material containing a stable, low-work function transition metal oxide having been deposited onto the refractory electrode material according to an embodiment of the present invention.
Figure 4:
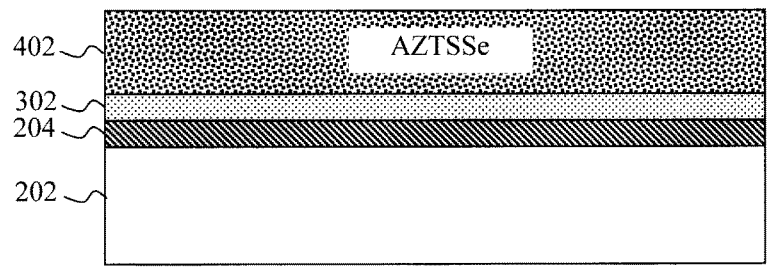
FIG. 4 is a cross-sectional diagram illustrating an AZTSSe absorber having been formed on the contact material according to an embodiment of the present invention.
Figure 5:
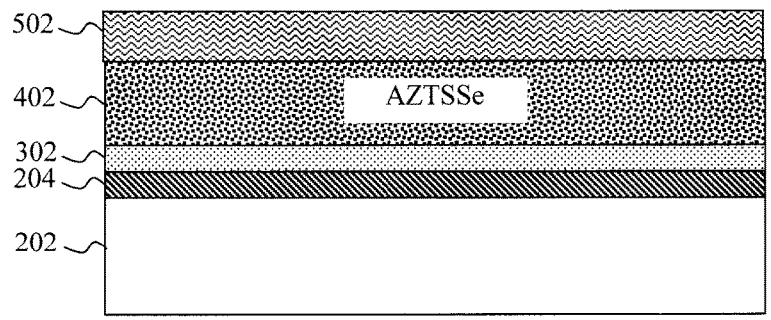
FIG. 5 is a cross-sectional diagram illustrating a buffer layer having been formed on the AZTSSe layer according to an embodiment of the present invention.

Next, as shown in FIG. 3, a contact material 302 containing a stable, low-work function transition metal oxide is deposited onto the refractory electrode material 204. As provided above, suitable stable, low-work function transition metal oxides include, but are not limited to, $TiO_2$, ZnO, SnO, ZnSnO, and/or $Ga_2O_3$.

The contact material 302 can be deposited onto the refractory electrode material 204 using, e.g., e-beam evaporation, atomic layer deposition, sputtering, etc. According to an exemplary embodiment, the contact material 302 is deposited on the refractory electrode material 204 to a thickness of from about 5 nanometers (nm) to about 100 nm, and ranges therebetween.

An AZTSSe absorber 402 is then formed on the contact material 302. See FIG. 4. As provided above, AZTSSe is a kesterite material containing Ag, Zn, Sn, and at least one of S and Se. Suitable techniques for forming an AZTSSe absorber are described in U.S. patent application Ser. No. 14/936,131. For instance, as provided in U.S. patent application Ser. No. 14/936,131, AZTSSe may be formed using thermal evaporation in a vacuum chamber wherein Ag, Zn, and Sn are co-evaporated from their respective sources. Optionally, a thermal cracking cell(s) can be used for the S and Se. For instance, as described in U.S. patent application Ser. No. 14/936,131, thermal cracking cells can be used to regulate the ratio of the S to the Se in the AZTSSe material, so as to control the band gap.

As also described in U.S. patent application Ser. No. 14/936,131, a sodium (Na)-containing layer (e.g., sodium fluoride (NaF), or sodium sulfide ($Na_2S$) or sodium selenide ($Na_2Se$)) can optionally be placed immediately before (or after) the AZTSSe absorber. Na from the layer gets incorporated into the absorber during annealing and can enhance its electrical properties.

Prior to forming the AZTSSe, it is preferable to clean the surface on which the AZTSSe is being formed to remove any potential contaminants. Any standard cleaning process may be used, which can vary depending on the electrode material being used. For instance, an ammonium hydroxide ($NH_4OH$) clean is suitable for a metal-coated substrate, whereas a sulfuric acid mixed with an inorganic oxidizer (such as NOCHROMIX® available from GODAX Laboratories, Inc., Cabin John, Md.) is preferable for transparent conducting oxides.

Once deposited on the substrate, the AZTSSe absorber 402 is then annealed. Annealing improves the crystal grain structure as well as the defect structure of the AZTSSe absorber 402, and in some cases may be necessary to form a material having a kesterite structure. According to an exemplary embodiment, the annealing is carried out at a temperature of from about 400° C. to about 550° C., and ranges therebetween, for a duration of from about 20 seconds to about 10 minutes, and ranges therebetween. If present, Na (from the Na-containing layer) will incorporate into the AZTSSe absorber 402 during this anneal.

According to an exemplary embodiment, the anneal is performed in an environment containing excess chalcogen, e.g., excess S and/or Se. See, for example, U.S. Pat. No. 8,642,884 issued to Mitzi et al., entitled "Heat Treatment Process and Photovoltaic Device Based on Said Process" (hereinafter "U.S. Pat. No. 8,642,884"), the contents of which are incorporated by reference as if fully set forth herein. As described in U.S. Pat. No. 8,642,884, a heat treatment process involving sulfurization or selenization passivates the layers/interfaces of the device and/or suppresses phase decomposition.

A buffer layer 502 is then formed on the AZTSSe absorber 402. See FIG. 5. As provided above, AZTSSe is intrinsically n-type. Accordingly, modifications to the device stack may be needed. For instance, regarding the buffer layer, materials traditionally used as a buffer such as cadmium sulfide (CdS) might not be appropriate. Accordingly, suitable alternative buffer materials for use with AZTSSe absorbers include, but are not limited to, copper(I) oxide ($Cu_2O$), nickel(II) oxide (NiO), zinc telluride (ZnTe), aluminum phosphide (AlP), molybdenum trioxide ($MoO_3$), cadmium telluride (CdTe), copper(I) iodide (CuI), molybdenum(IV) oxide ($MoO_2$), molybdenum disulfide ($MoS_2$), and/or molybdenum diselenide ($MoSe_2$). The semiconductors (e.g., $Cu_2O$, CuI, etc.) are "p-type heterojunction partners" while some of the materials in the list are simply high-work function contacts (e.g., $MoO_3$). According to an exemplary embodiment, the buffer layer 502 is deposited using chemical bath deposition, thermal or e-beam evaporation, atomic layer deposition, electrodeposition or sputtering to a thickness of from about 5 nm to about 200 nm, and ranges therebetween.

Figure 6:
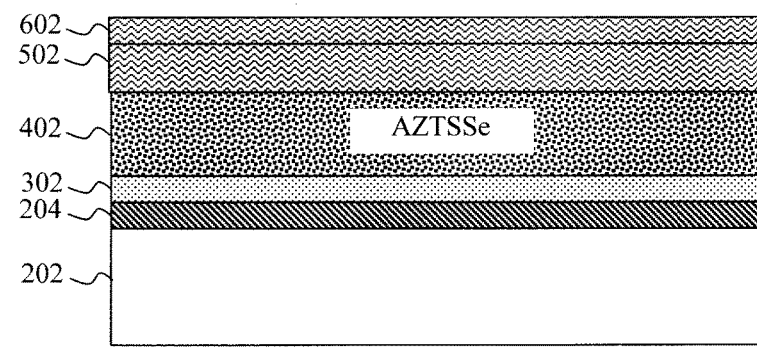
FIG. 6 is a cross-sectional diagram illustrating a top electrode having been formed on the buffer layer according to an embodiment of the present invention.
Figure 7:
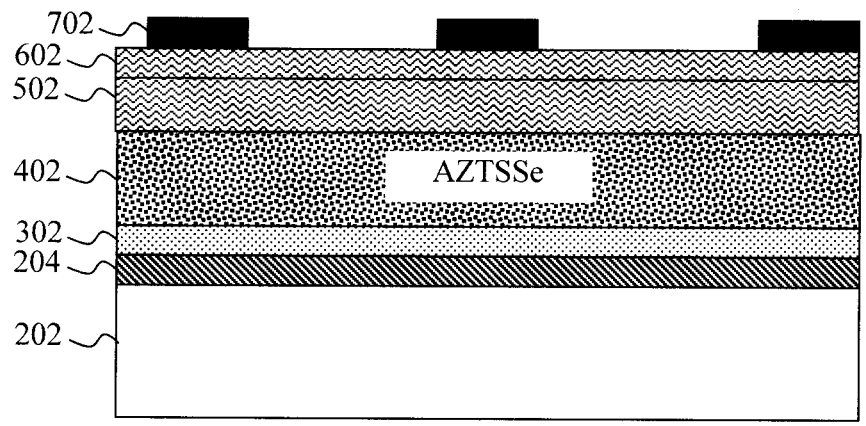
FIG. 7 is a cross-sectional diagram illustrating metal contacts having been formed on the top electrode according to an embodiment of the present invention.

As shown in FIG. 6, a top electrode 602 can then be formed on the buffer layer 502. According to an exemplary embodiment, the top electrode 602 is formed from a transparent conductive oxide (TCO), such as indium-tin-oxide (ITO) and/or aluminum (Al)-doped zinc oxide (ZnO) (AZO)). By way of example only, the top electrode 602 can be deposited onto the buffer layer 502 using sputtering.

Metal contacts 702 may be formed on the top electrode 602. See FIG. 7. According to an exemplary embodiment, the metal contacts 702 are formed from gold (Au), silver (Ag), aluminum (Al) and/or nickel (Ni). The metal contacts 702 may be formed on the top electrode 602 using a process such as e-beam or thermal evaporation.

Figure 8:
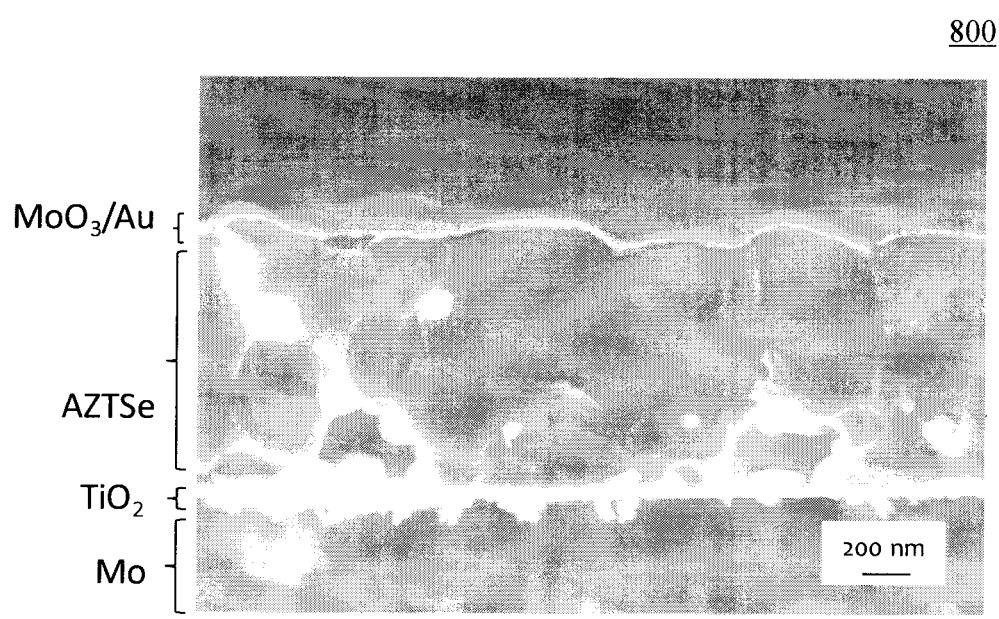
FIG. 8 is an image of a photovoltaic device sample prepared using the present techniques according to an embodiment of the present invention.

The present techniques are further described by way of reference to the following non-limiting examples. A photovoltaic device was prepared according to the present techniques including a glass substrate, and Mo as the refractory electrode material 204. A 20 nm thick layer of $TiO_2$ was then deposited (using e-beam evaporation) as the contact material 302 on the Mo. Following the above process flow, an AZTSSe absorber 402 was formed on the $TiO_2$, followed by a $MoO_3$ (buffer layer 502) and Au metal contacts 702. An image 800 of the resulting device is shown in FIG. 8.

Figure 9:
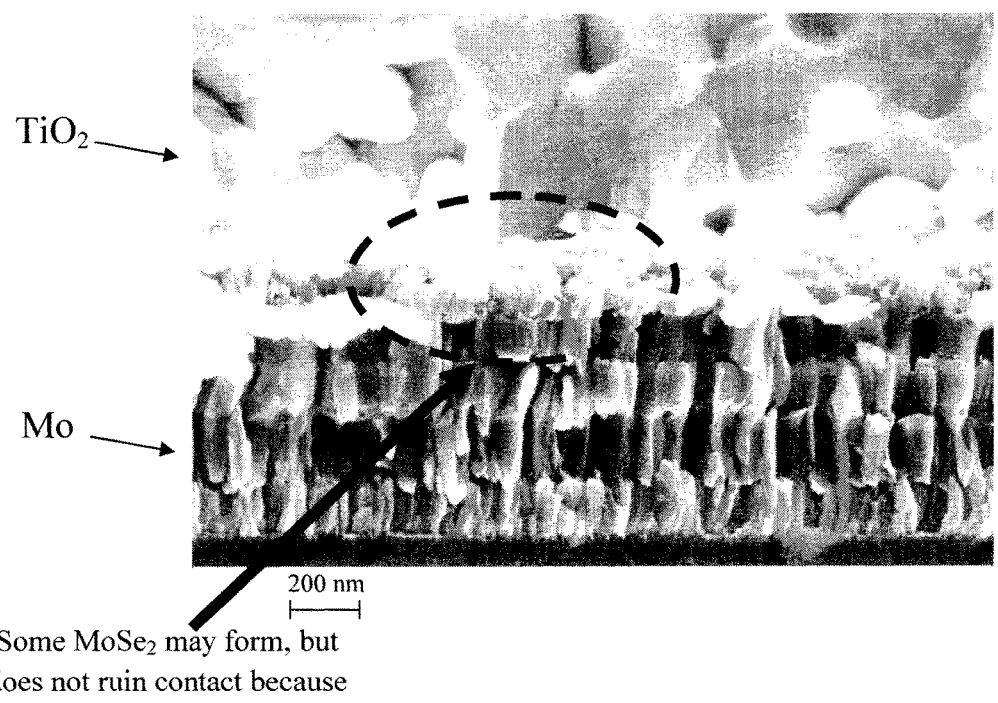
FIG. 9 is an enlarged image of the junction between the refractory electrode material (e.g., Mo) and the contact material (e.g., TiO$_2$) according to an embodiment of the present invention.

An enlarged view of the Mo/$TiO_2$ interface is provided in FIG. 9. As shown in FIG. 9, there might still be the formation of some $MoSe_2$ beneath the $TiO_2$ layer. However, this does not ruin the contact to the underlying metal (in this case Mo) due to the presence of the $TiO_2$. The $MoSe_2$, if any, merely adds to the series resistance.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for forming a photovoltaic device, the method comprising the steps of:
    depositing a refractory electrode material onto a substrate;
    depositing a contact material onto the refractory electrode material, wherein the contact material comprises a transition metal oxide with a work function below about 4.5 electronvolts (eV), and wherein the contact material as deposited is in direct physical contact with the refractory electrode material;
    forming an absorber layer directly on the contact material, wherein the absorber layer comprises silver (Ag), zinc (Zn), tin (Sn), and at least one of sulfur (S) and selenium (Se);
    annealing the absorber layer;
    forming a buffer layer on the absorber layer; and
    forming a top electrode on the buffer layer.

2. The method of claim 1, wherein the substrate comprises a glass, a ceramic, a metal foil, or a plastic substrate.

3. The method of claim 1, wherein the refractory electrode material is selected from the group consisting of: molybdenum (Mo), tungsten (W), platinum (Pt), titanium (Ti), titanium nitride (TiN), fluorinated tin oxide (FTO), and combinations thereof.

4. The method of claim 1, wherein the refractory electrode material has a thickness of from about 0.5 micrometer to about 2 micrometers, and ranges therebetween.

5. The method of claim 1, wherein the transition metal oxide is selected from the group consisting of: titanium oxide ($TiO_2$), zinc oxide (ZnO), tin oxide (SnO), zinc tin oxide (ZnSnO), gallium oxide ($Ga_2O_3$), and combinations thereof.

6. The method of claim 1, wherein the transition metal oxide comprises $TiO_2$.

7. The method of claim 1, wherein the contact material has a thickness of from about 5 nanometers to about 100 nanometers, and ranges therebetween.

8. The method of claim 1, wherein the absorber layer is annealed at a temperature of from about 400° C. to about 550° C., and ranges therebetween, for a duration of from about 20 seconds to about 10 minutes, and ranges therebetween.

9. The method of claim 1, wherein the buffer layer comprises a buffer material selected from the group consisting of: copper(I) oxide ($Cu_2O$), nickel(II) oxide (NiO), zinc telluride (ZnTe), aluminum phosphide (AlP), molybdenum trioxide ($MoO_3$), cadmium telluride (CdTe), copper(I) iodide (CuI), molybdenum(IV) oxide ($MoO_2$), molybdenum disulfide ($MoS_2$), molybdenum diselenide ($MoSe_2$), and combinations thereof.

10. The method of claim 1, wherein the buffer layer comprises $MoO_3$.

11. The method of claim 1, wherein the top electrode comprises a transparent conductive oxide.

12. The method of claim 11, wherein the transparent conductive oxide is selected from the group consisting of: indium-tin-oxide, aluminum-doped zinc oxide, and combinations thereof.

13. The method of claim 11, further comprising the step of:
    forming metal contacts on the top electrode.

14. The method of claim 13, wherein the metal contacts comprise a metal selected from the group consisting of: gold (Au), silver (Ag), aluminum (Al), nickel (Ni), and combinations thereof.

15. The method of claim 1, wherein the transition metal oxide is selected from the group consisting of: $TiO_2$, SnO, ZnSnO, $Ga_2O_3$, and combinations thereof.

* * * * *